PROCESS FOR CONTACTING A SEMICONDUCTOR DEVICE

Original Filed July 28, 1967 2 Sheets-Sheet 1

United States Patent Office 3,737,380
Patented June 5, 1973

3,737,380
PROCESS FOR CONTACTING A SEMICONDUCTOR DEVICE

Alfred Bachmeier, Schwaigern, Germany, assignor to Telefunken Patentverwertungsgesellschaft m.b.H., Ulm (Danube), Germany Original application July 28, 1967, Ser. No. 656,927. Divided and this application Dec. 15, 1969, Ser. No. 885,337
Claims priority, application Germany, Aug. 30, 1966, T 31,914
Int. Cl. C23b 5/48
U.S. Cl. 204—15 5 Claims

ABSTRACT OF THE DISCLOSURE

A semiconductor region bounded by a window of a diffusion-inhibiting layer is provided with a vapor-deposited nickel layer, then a vapor-deposited silver layer, and finally with a silver boss galvanically deposited onto the silver layer and overlapping the diffusion-inhibiting layer.

CROSS-REFERENCES TO RELATED APPLICATIONS

This is a divisional application to copending application Ser. No. 656,927, filed July 28, 1967, and now abandoned.

BACKGROUND OF THE INVENTION

The invention relates to a method for contacting a semiconductor device, such as diode or a transistor.

SUMMARY OF THE INVENTION

A method of producing a conductive contact on a semiconductor region exposed by a window, wherein a layer of nickel is vapor-deposited through the window onto the semiconductor, then a layer of silver is vapor-deposited onto the nickel layer, followed by a deposition of a silver boss onto the silver layer and overlapping the edges of the window.

DESCRIPTION OF THE PREFERRED EMBODIMENTS

Figure 1:
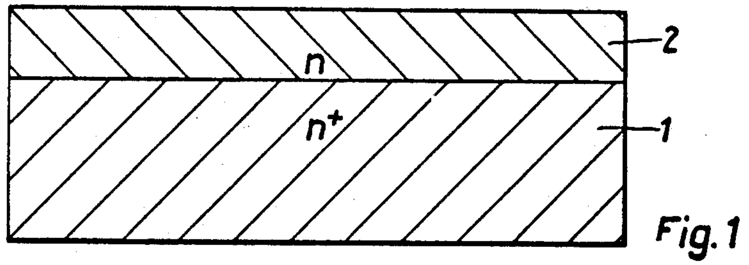
FIG. 1 is an elevational cross section through a semiconductor block.

FIG. 1 shows the first step in the manufacture of a planar diode according to the invention. This represents an example of the use of the method of the invention to contact a region of one conductivity type set up in a region of opposite conductivity type. The starting material is a semiconductor body 1 of silicon which has $n^+$-type conductivity. As shown in FIG. 1, an epitaxial layer 2 of silicon, which likewise has n-type conductivity but is less heavily doped than the basic semiconductor body 1, is applied to the substrate formed by the semiconductor body 1.

Figure 2:
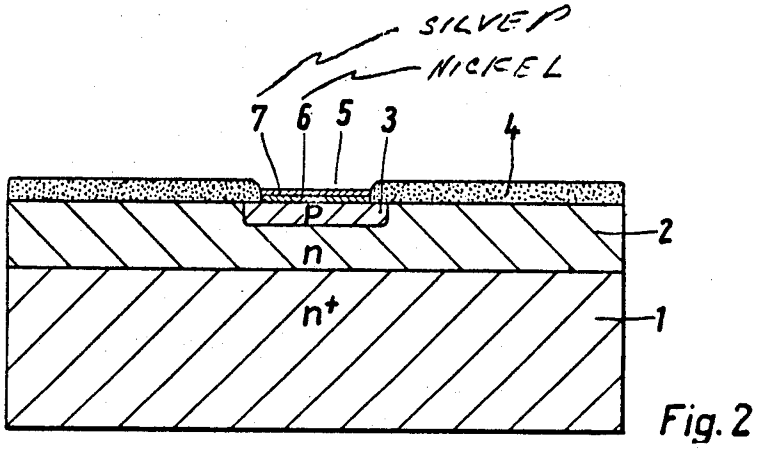
FIG. 2 is the view of FIG. 1, containing additional structure.

In order to produce a semiconductor region 3 of p-type conductivity, the surface of the epitaxial layer 2 is provided, as shown in FIG. 2, with a diffusion-inhibiting layer 4, which consists for example of silicon dioxide or silicon nitride.

As shown in FIG. 2, a diffusion window 5 is made in this diffusion-inhibiting layer 4, through which window the semi-conductor region 3 of p-type conductivity is set up by diffusion in the epitaxial layer 2 of n-type conductivity. Thus a p-n junction is created below the window 5.

According to FIG. 2, the making of contact to the semiconductor region 3 of p-type conductivity is effected according to the invention in such a manner that first a nickel layer 6 and immediately succeeding a silver layer 7 are vapor-deposited on the surface of the p-type region in, and limited to, the area of the diffusion window, so that a layer of nickel with a layer of silver above it is obtained for making contact. The vapor-deposition temperature amounts to 600–700° C. for example for the vapour-deposition of both layers, while the vapour-deposition process for both layers takes about 10 minutes. Thicknesses of from 0.3 to 0.6$\mu$ are recommended both for the nickel layer and for the silver layer.

Figure 3:
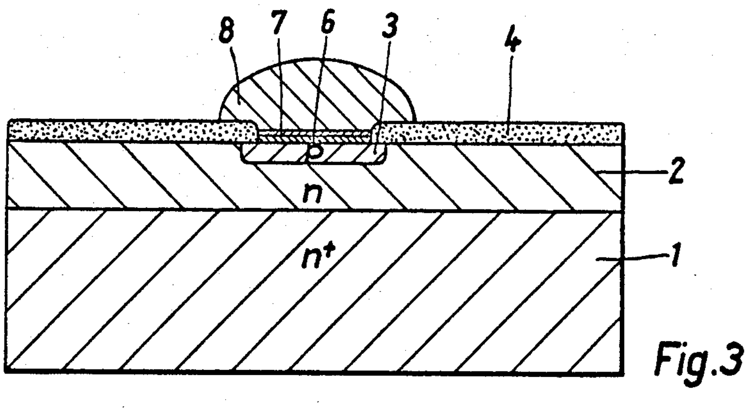
FIG. 3 is the view of FIG. 2, containing additional structure.

Finally, as shown in FIG. 3, a silver boss 8 which extends laterally over the diffusion-inhibiting layer is galvanically deposited on the vapour-deposited silver layer. This silver boss rises so high above the surface of the semiconductor and also above the diffusion-inhibiting layer that contact can easily be made to it—and hence also to the semiconductor region 3 of p-type conductivity—by means of a contact placed thereon.

Figure 4:
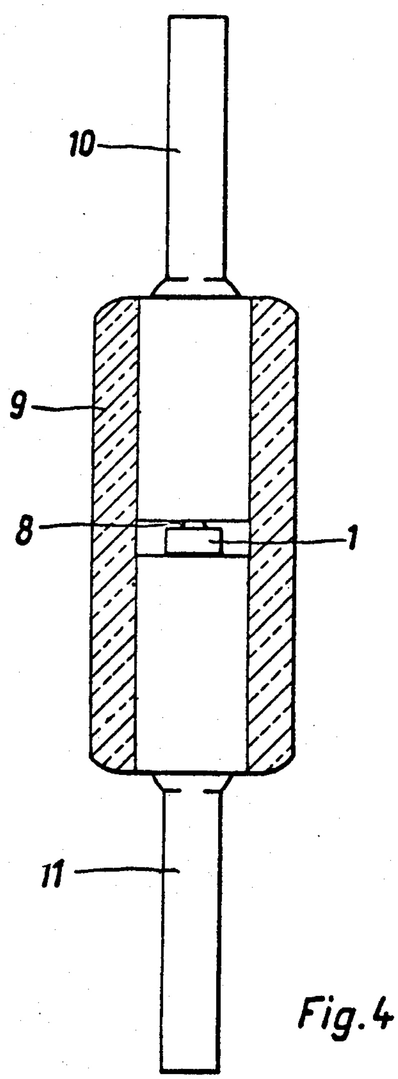
FIG. 4 is a longitudinal cross section of a further development of the structure of FIG. 3.

FIG. 4 shows the finished planar diode accommodated within a semiconductor housing. In the example, the semiconductor housing consists of a small glass tube 9 into both ends of which copper-sheathed wires 10 and 11 are sealed by fusion. The wires 10 and 11 have an iron nickel core. Between the two wires 10 and 11 is the semiconductor system of FIGS. 1 to 3. Whereas contact is made to the silver boss 8 and hence to the p-type region in the epitaxial layer of silicon present on the silicon body by means of the copper-sheathed wire 10, contact is made to the semiconductor substrate 1 by means of the copper-sheathed wire 11 on which the semiconductor body rests, through a vapour-deposited nickel-silver layer. The procedure for vapor-depositing a nickel-silver layer on a region of n-type conductivity is precisely the same as that for the region of p-type conductivity described above.

The planar diode in FIG. 3 represents a very stable semiconductor device because, on the one hand, contact between the silver boss and the copper-sheathed wire 10 as well as the contact between the semiconductor body and the copper-sheathed wire 11 is very satisfactory, and on the other hand, the copper-sheathed wires are sealed in a vacuum-tight manner to the glass tube 9.

A transistor can be obtained in a simple manner from the planar device shown in FIG. 2 if a semiconductor region of n-type conductivity, to be used as an emitter region, is introduced into the semiconductor region 3 of p-type conductivity by the planar technique, while the semiconductor region 3 of p-type conductivity then serves as a base region. As in the example of a planar diode described, contact can also be made to semiconductor regions of the transistor, such as the emitter region or base region, by the method according to the invention.

The present invention is advantageous, for example, in the contacting of planar devices, such as the above-described planar diode and planar diodes or planar transistors in general. The essential advantage of the invention consists in that, with semiconductor bodies of silicon, contact can be made with the same contact material to regions of any desired type of conductivity, that is to say to semiconductor regions of n-type conductivity as well as p-type conductivity. The connection between semiconductor material and contact material has a very high melting point so that the semiconductor body can be exposed to very high temperatures during mounting. In addition, the contacts are resistant to thermal fatigue.

I claim:

1. A method of producing a conductive contact on a semiconductor region exposed by a window of a diffusion-inhibiting layer, comprising the steps of applying a layer of nickel by vapour-deposition onto said region, applying by vapour-deposition a layer of silver onto said nickel layer, and galvanically depositing a silver boss onto said silver layer and overlapping said diffusion-inhibiting layer.

2. A method as claimed in claim 1 wherein the vapor-depositions are performed at a temperature of from 600 to 700° C.

3. A method as claimed in claim 1, wherein the thickness of the vapour-deposited layers is from 0.3 to 0.6$\mu$.

4. A method as claimed in claim 1, wherein the semiconductor material of the semiconductor region is silicon.

5. A method as claimed in claim 1, wherein the nickel and silver layers applied by vapour-deposition are limited to the area of said window.

References Cited

UNITED STATES PATENTS

| | | | |
|---|---|---|---|
| 3,462,349 | 8/1969 | Gorgenyl | 317—234 M |
| 3,221,219 | 11/1965 | Emeis et al. | 317—234 |
| 3,476,984 | 11/1969 | Tibol | 117—212 |
| 3,496,428 | 2/1970 | Volder | 317—234 M |
| 3,361,592 | 1/1968 | Quetsch, Jr. et al. | 317 235 AQ |

ALFRED L. LEAVITT, Primary Examiner

C. K. WEIFFENBACH, Assistant Examiner

U.S. Cl. X.R.

117—212, 217, 107; 204—23, 38 B; 317—234 M, 234 N